(12) United States Patent
Isobe

(10) Patent No.: US 6,894,389 B2
(45) Date of Patent: May 17, 2005

(54) SEMICONDUCTOR DEVICE AND MANUFACTURING METHOD THEREFOR

(75) Inventor: Shinobu Isobe, Tateyama (JP)

(73) Assignee: UMC Japan, Chiba-Ken (JP)

( * ) Notice: Subject to any disclaimer, the term of this patent is extended or adjusted under 35 U.S.C. 154(b) by 0 days.

(21) Appl. No.: 10/602,977

(22) Filed: Jun. 24, 2003

(65) Prior Publication Data

US 2004/0000714 A1 Jan. 1, 2004

(30) Foreign Application Priority Data

Jun. 7, 2002 (JP) ........................................ 2002-188524

(51) Int. Cl.$^7$ ............................................. H01L 23/48
(52) U.S. Cl. ...................................... 257/737; 257/778
(58) Field of Search ................................ 257/737, 738, 257/778, 627, 618

(56) References Cited

U.S. PATENT DOCUMENTS 5,273,940 A * 12/1993 Sanders ....................... 438/107
6,091,141 A * 7/2000 Heo ............................. 257/704
6,506,681 B2 * 1/2003 Grigg et al. ................. 438/692

* cited by examiner

Primary Examiner—Roy Potter
(74) Attorney, Agent, or Firm—Cohen, Pontani, Lieberman & Pavane

(57) ABSTRACT

In a method for manufacturing a semiconductor device according to the present invention, a back surface on a silicon wafer is ground and, after that, mirror-finished. A breakable layer on a back surface is removed. A silicon wafer is formed in the silicon wafer has a back surface in which a crystalline layer which is disposed innermore than the breakable layer is exposed. Bumps are formed on predetermined positions on a surface on the silicon wafer. By doing this, it is possible to provide a semiconductor device and a method for manufacturing therefore in which it is possible to prevent a crack from being formed on the semiconductor base board caused by a stress in a process for forming the bumps. As a result, it is possible to improve the production yield in the process for forming the bumps. Also, it is possible to realize more integration in the semiconductor device by a lower production cost.

1 Claim, 5 Drawing Sheets

SEMICONDUCTOR DEVICE AND MANUFACTURING METHOD THEREFOR

BACKGROUND OF THE INVENTION

1. Field of the Invention

Present invention relates to a semiconductor device and method for manufacturing therefore. The present invention particularly relates to a semiconductor device which can be used for a thin semiconductor base board preferably such that it is possible to improve a production yield in a process for forming a bump by preventing a crack on the semiconductor base board caused by a stress in a process for forming the bump, and method for manufacturing therefore.

2. Description of Related Art

Conventionally, in a semiconductor device such as an IC (integrated circuit), an LSI (large scale integrated circuit), and a VLSI (very large scale integrated circuit), a bump is formed according to various methods. That is, in a method, a metal ball is compressed on a position such as a pad section for forming the bump on a silicon wafer (semiconductor base board). In other method, a bump is formed by printing a metal paste. Yet, in other method, a bump is formed by connecting a wire bonding. These methods are selectively determined according to factors such as a shape and size of bump to be formed.

Also, there are various shapes and sizes for the bump to be formed because various shapes and sizes are required for a final package.

Recently, further smaller and thinner semiconductor device has been required; thus, further thinner silicon wafer has been required inevitably.

Such a thin silicon wafer is produced by grinding one side of an oridinary silicon wafer.

FIGS. 5A to 5E show an example for manufacturing process for an ordinary thin silicon wafer. In these drawings, features such as a shape and a dimension ratio in a thin silicon wafer are described differently from actual dimensions.

In this manufacturing process, pads 2 which are made of an aluminum member are formed by performing a vapor deposition or a sputtering operation on predetermined positions on a surface 1a (other principal surface) of a silicon wafer as shown in FIG. 5A. A metal plating layer 3 which is made of a nickel member is formed on the pads 2 by a method such as a plating method. After that, a solder balls 4 are compressed on the metal plating layers 3, or a solder paste is applied on the metal plating layers 3.

After that, the solder balls 4 melts so as to be a solder layers 5 by heating the solder paste in a predetermined temperature as shown in FIG. 5B. Thus, bumps 6 in a two-layer-structure which are made of the metal layers 3 and the solder layers 5 are formed. Here, sometimes, a gold plating layer may be used instead of the solder layer.

Next, a wafer is tested for measuring an electric characteristics of the silicon wafer 1 in which the bumps 6 are formed.

Next, as shown in FIG. 5C, a protecting tape 8 is applied on the bumps 6, 6 ... on the silicon wafer 1 via a bonding agent layer 7. Next, as shown in FIG. 5D, the silicon wafer 1 is mounted on a wafer stage 9 such that the protecting tape 8 contacts the wafer stage 9. A back surface 1b (a principal surface) of the silicon wafer 1 is ground by a predetermined depth by using a grinding device (not shown in the drawing). By doing this, a silicon wafer 12 which are formed by a predetermined depth can be obtained.

After the grinding operation, as shown in FIG. 5E, the protecting tape 8 is removed from the silicon wafer 12. The silicon wafer 12 as a final product is shipped after the necessary packaging is conducted.

FIGS. 6A to 6D show other example for a manufacturing process for an ordinary thin silicon wafer. In these drawings, features such as a shape and a dimension ratio in a thin silicon wafer are described differently from actual dimensions.

In this manufacturing process, as shown in FIG. 6A, pads 2 made of an aluminum member are formed in predetermined positions on a surface 1a on the silicon wafer 1 by performing a vapor deposition or a sputtering operation. A protecting tape 8 is applied on the surface 1a on which the pads 2 are formed. The silicon wafer 1 is mounted on a wafer stage 9 such that the protecting tape 8 contacts the wafer stage 9. A back surface 1b of the silicon wafer 1 is ground by a predetermined depth by using a grinding device (not shown in the drawing).

After the grinding operation, the protecting tape 8 is removed. As shown in FIG. 6B, a silicon wafer 12 having a predetermined thickness can be obtained by grinding the silicon wafer 1.

Next, as shown in FIG. 6C, metal plating layers 3 made of a nickel member or the like are formed on the pads 2 which are formed on the surface 1a on the silicon wafer 12 by a method such as a plating method. After that, solder balls 4 are compressed on the plating layers 3. Otherwise a solder pasta is applied.

After that, the solder balls 4 melt to form solder layers 5 by heating the solder paste in a predetermined temperature as shown in FIG. 6D. Thus, bumps 6 having a two-layer-structure which are made of metal plating layers 3 and the solder layers 5 are formed on the pads 2.

Next, the silicon wafer 12 is tested for measuring an electric characteristics of the silicon wafer 12 on which the bumps 6 are formed. The silicon wafer 12 as a final product is shipped after the necessary packaging is conducted.

However, in the above ordinary thin silicon wafer 12, there are various problems as follows.

For example, when the silicon wafer 1 is ground after the bumps 6 are formed, the back surface 1b of the silicon wafer 1 is ground under condition that a diamond grinding wheel 16 in which a diamond grains are embedded is rotated and compressed to the back surface 1b so as to grind the back surface 1b as shown in FIG. 7. In such a case, each bump 6 becomes a factor for compressing inside the silicon wafer 1; thus, a stress is applied inside the silicon wafer 1. As a result, protrusions 17, 17 ... are formed in a corresponding position to bumps 6, 6 ... on a back surface 1b of the silicon wafer 1 according to gaps made by the bumps 6. In such a case, there is a problem in that a flatness on a back surface 1b on the silicon wafer 1 cannot be realized.

In order to avoid such a decreased flatness, various methods are proposed. According to one of such methods, thickness of the protecting tape 8 is increased so as to soften the stress caused by each bump 6, 6 .... Alternatively, according to other method, a bonding agent which is pliable enough to absorb the gap caused by the bump 6 is used instead of the bonding agent 7 and the protecting tape 8. However, it is difficult to realize a complete flatness on a back surface 1b on the silicon wafer 1.

Also, when the bump 6 is formed after the back surface 1b on the silicon wafer 1 is ground, a lot of micro-cracks 18, 18, ... exist by an approximately 1 μm of depth which are formed in a grinding operation on a back surface 12b on the thin silicon wafer 12 as shown in FIG. 8. Therefore, these micro-cracks 18, 18, . . . become a stress factor thereinside due to a compression 19 which is applied when the solder balls 4 are compressed; thus, there is a concern that a crack and a split occur on the silicon wafer 12. For such a case, it is common that the bump 6 is formed according to a plating method or a printing method instead of using the solder balls 4 such that too much stress is not applied on the silicon wafer 12. However, there are problems according to these methods because it is not possible to form a finer structure in the silicon wafer and the production cost is high.

SUMMARY OF THE INVENTION

The present invention was made in consideration of the above problems. An object of the present invention is to prevent a crack from occurring on the semiconductor base board due to a stress caused by a stress in a bump forming operation and improve the production yield in the bump forming process. Yet, another object of the present invention is to provide a semiconductor device which can realize a finer structure therein by a low cost and a method for manufacturing therefore.

In order to solve the above problems, following semiconductor device and a method for manufacturing therefore are adapted in the present invention.

That is, according to a first aspect of the present invention, a semiconductor device is characterized in that a principal surface of a semiconductor base board is ground mirror-finished such that a breakable layer on the principal surface is removed and a crystalline layer which is disposed innermore than the breakable layer is exposed, and bumps are formed on a predetermined position on other principal surface of the semiconductor base board.

According to a second aspect of the present invention, a method for manufacturing a semiconductor device is characterized in having the steps for grinding a principal surface on a semiconductor base board, mirror-finishing the principal surface so as to remove a breakable layer on the principal surface and expose a crystalline layer which is disposed innermore than the breakable layer, and forming bumps on predetermined positions on other principal surface on the semiconductor base board.

According to a third aspect of the present invention, a method for manufacturing a semiconductor device is characterized in that a principal surface on a semiconductor base board is ground after the other principal surface on the semiconductor base board is coated by a protecting member.

As explained above, according to a semiconductor device of the present invention, a principal surface of a semiconductor base board is ground and mirror-finished such that a breakable layer on the principal surface is removed and a crystalline layer which is disposed innermore than the breakable layer is exposed, and bumps are formed on a predetermined position on other principal surface of the semiconductor base board. Therefore, there is an effect in that a crack because of a stress which is caused in a process for forming the bumps is not formed on the semiconductor base board; therefore, the semiconductor device according to the present invention has superior electric characteristics and reliability. Also, it is possible to realize more integration in the semiconductor device; therefore, it is possible to realize more integration in the semiconductor device by a lower production cost.

Also, according to a method for manufacturing a semiconductor device according to the present invention, a principal surface of a semiconductor base board is ground and mirror-finished such that a breakable layer on the principal surface is removed and a crystalline layer which is disposed innermore than the breakable layer is exposed, and bumps are formed on a predetermined position on other principal surface of the semiconductor base board. Therefore, there is an effect it is possible to prevent a crack from being formed on the semiconductor base board. As a result, it is possible to improve the production yield in a process for forming the bumps. Also, it is possible to realize more integration in the semiconductor device; therefore, it is possible to realize more integration in the semiconductor device by a lower production cost.

DETAILED DESCRIPTION OF THE INVENTION

Figure 1A:
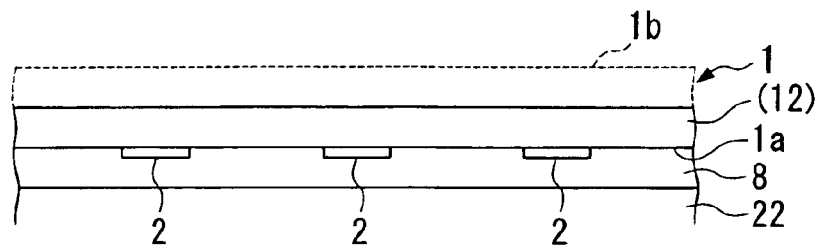
FIGS. 1A to 1E show a method for manufacturing a semiconductor device according to an embodiment of the present invention.

An embodiment of a semiconductor device and a method for manufacturing the same according to the present invention is explained with reference to the drawings.

Here, the same reference numerals are added to features in FIGS. 5A to 6C as those in FIGS. 1A to 1E. Also, in the drawings, features such as a shape and a dimension ratio in a thin silicon wafer are described differently from actual dimensions because it helps understanding the essential point of each feature.

Figure 2:
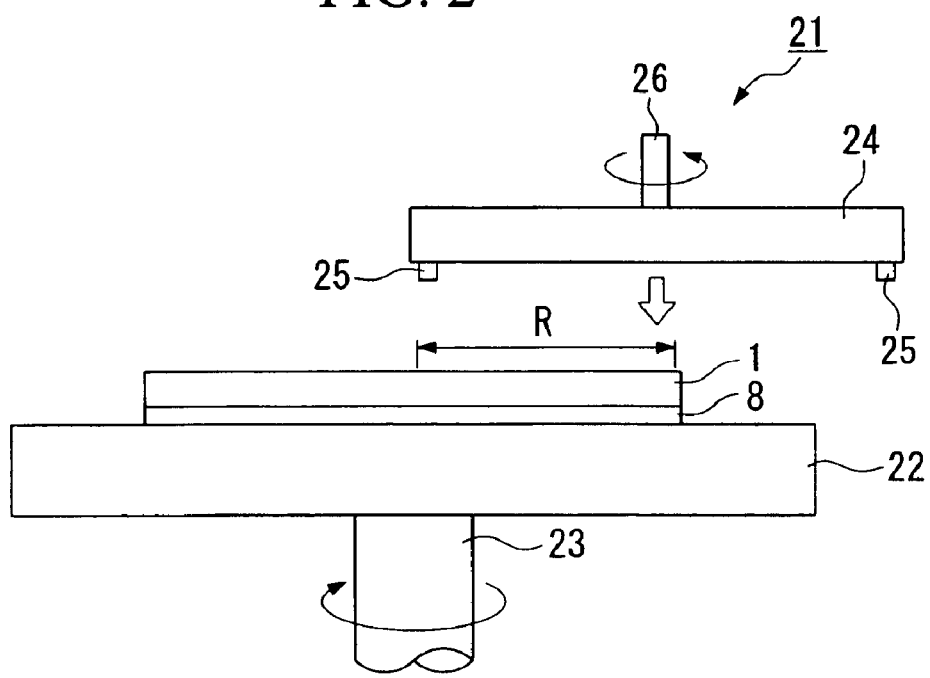
FIG. 2 is a front view of a grinding device which is used in a manufacturing method for a semiconductor device according to an embodiment of the present invention.

First, as shown in FIG. 1A, pads 2 which are made of an aluminum member are formed on predetermined positions on a surface (other principal surface) on a silicon wafer 1 (semiconductor base board) having approximately 600 $\mu$m of thickness by a vapor deposition or a sputtering operation. A protecting tape (protecting member) 8 is applied on the surface 1a on which the pads 2 are formed. The silicon wafer 1 is mounted on a predetermined position on a rotating stage 22 which is explained later on a grinding device 21 as shown in FIG. 2. A back surface (a principal surface) 1b on the silicon wafer 1 is ground by a predetermined depth by using the grinding device 21; thus, a thin silicon wafer 12 is obtained.

The grinding device 21 comprises a rotating stage 22 for mounting a silicon wafer 1 thereon, a shaft 23 which is fixed beneath a bottom surface of the rotating stage 22, a diamond wheel which is disposed so as to face the rotating stage 22, a plurality of grinding blades 25, made of a grinding stones containing a diamond grain or a cemented carbide grinding stones, which are attached around a peripheral section beneath the bottom surface of the diamond wheel 24, and a shaft 26 which is fixed in a center on an upper surface of the diamond wheel 24. Here, the rotating stage 22 and the diamond wheel 24 rotate in opposite direction by a control section which is not shown in the drawing. Simultaneously, the diamond wheel 24 can freely advance to and retract from the rotating stage 22. The diamond wheel 24 can be fixed any desirable position.

In the grinding device 21, first, the diamond wheel 24 if moved upwardly. Under such a condition, the silicon wafer 1 on which surface 1a a protecting tape 8 is applied is mounted on a predetermined position on the rotating stage 22. The rotating stage 22 rotates in a predetermined direction. Next, diamond wheel 24 is moved downward gradually while the diamond wheel 24 rotates in an opposite direction to the rotation of the rotating stage 22. Under such a condition, the grinding blades 25, 25, . . . is compresses on a back surface (a principal surface) 1b on a silicon wafer 1 by a predetermined force.

Here, the rotating stage 22 and the diamond wheel 24 are rotating oppositely each other; the entire back surface 1b on the silicon wafer 1 is ground uniformly by a plurality of rotating grinding blades 25, 25 . . . . That is, a grinding area R which is ground by the grinding blades 25, 25, . . . is equivalent to a diameter of the silicon wafer 1; thus, the entire back surface 1b on the silicon wafer 1 is a grinding area because both the silicon wafer 1 and the grinding blades 25, 25, . . . rotate.

Figure 3:
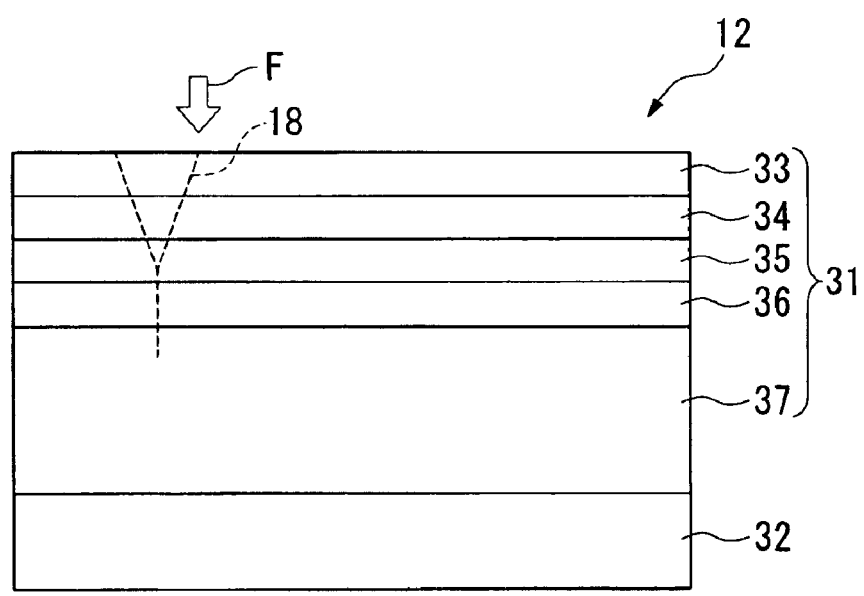
FIG. 3 is a cross section showing a structure in the silicon wafer after the silicon wafer is ground.

When a cross section of the silicon wafer 12 which is produced by grinding the back surface 1b is observed, as shown in FIG. 3, there is a multi-layer structure in which a breakable layer 31 (by approximately 30 $\mu$m depth from the back surface) in which a micro-crack 18 can be observed and a crystalline layer 32 (deeper than approximately 30 $\mu$m of the the depth from the back surface) in which any micro-crack 18 cannot be observed are formed. The breakable layer 31 is formed by an amorphous layer 33, a poly-crystalline layer 34 (approximately 0.2 to 0.3 $\mu$m deep from the back surface), a mosaic layer 35 (approximately 0.3 to 0.5 $\mu$m deep from the back surface), a crack layer 36 (approximately 0.5 to 1 $\mu$m deep from the back surface), and a distortion layer 37 (approximately 1 to 30 $\mu$m deep from the back surface).

Figure 1B:
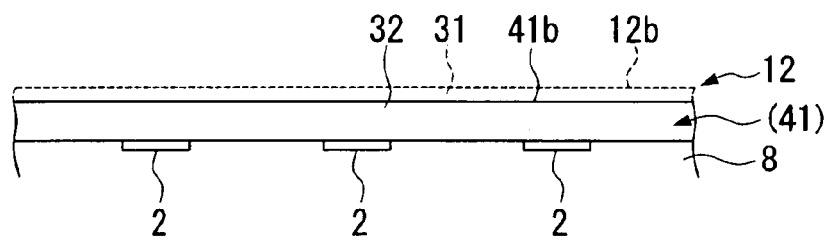

A micro-crack 18 is formed by a grinding force F approximately in 1 to 30 $\mu$m depth from the back surface. Therefore, as shown in FIG. 1B, by mirror-finishing the ground back surface 12b on the silicon wafer 12 by 1 to 30 $\mu$m deep from the back surface; thus, the breakable layer 31 which is produced in the grinding operation is removed. Therefore, the crystalline layer in which any micro-crack cannot observed can be exposed.

For a method for performing a mirror-finishing operation, it is possible to employ a mirror-finishing method which is commonly known. For example, a grinding method is preferable in which the back surface of the silicon wafer is mirror-finished by using a mirror-finishing pad which contains a mirror-finishing member such as an aluminium nitride. Also, a chemical mirror-finishing method is preferable in which a slurry which contains a fine grinding grain such an alumina is poured between the silicon wafer 1 and the mirror-finishing pad, and the silicon wafer 1 and the mirror-finishing pad are rotated oppositely so as to mirror-finish the back surface 1b on the silicon wafer 1.

By doing this, the back surface 1b on the silicon wafer 1 is ground and mirror-finished by a predetermined depth, and a breakable layer 31 is removed. Therefore, a thin silicon wafer 41 can be produced in which the crystalline layer 32 is exposed on a back surface 41b, and the thickness of the silicon wafer 41 is no thicker than 200 $\mu$m.

Figure 1C:
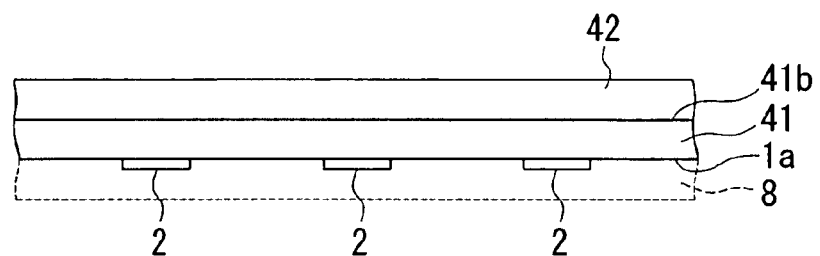

Next, as shown in FIG. 1C, the protecting tape 8 is removed from a back surface 1a on the silicon wafer 41, and a protecting tape (protecting member) 42 is applied on the back surface 41b on the silicon wafer 41. The protecting tape 42 serves a cushion so as to soften a compression which occurs in a process for compressing a bump electrode thereafter. The protecting tape 42 also supporting a cutting chip which is used in a dicing operation in which the silicon wafer is cut into pieces of the silicon chip as a final product. The protecting tape 42 further serves as an armature member in consideration of transportation purpose.

Figure 1D:
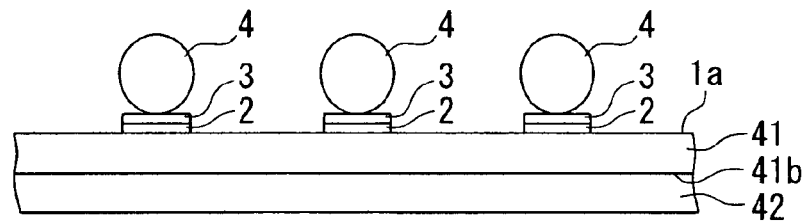

Next, as shown in FIG. 1D, metal plating layers 3 made of a nickel member and the like are formed on the pads 2 which are formed on the surface 1a on the silicon wafer 41 by a plating method or the like. After that, the solder balls 4 are compressed on the metal plating layers 3, or solder paste are applied on the metal plating layers 3. Consequently, the silicon wafer 41 is heated in a predetermined temperature.

Figure 4:
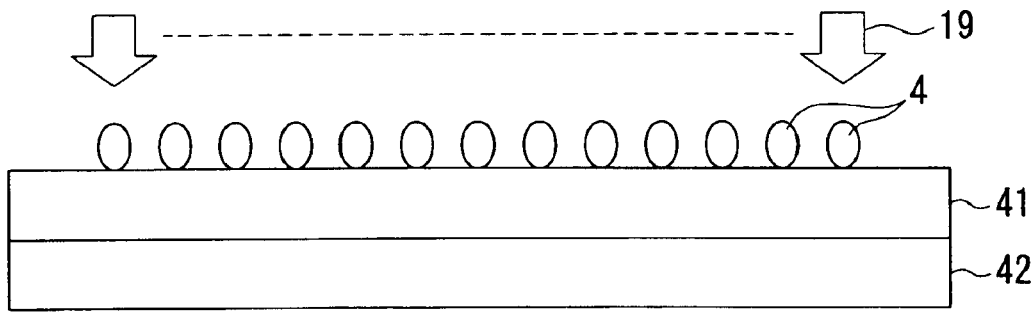
FIG. 4 shows how a compression is applied when the solder balls are compressed in a manufacturing method for a semiconductor device according to an embodiment of the present invention.
Figure 7:
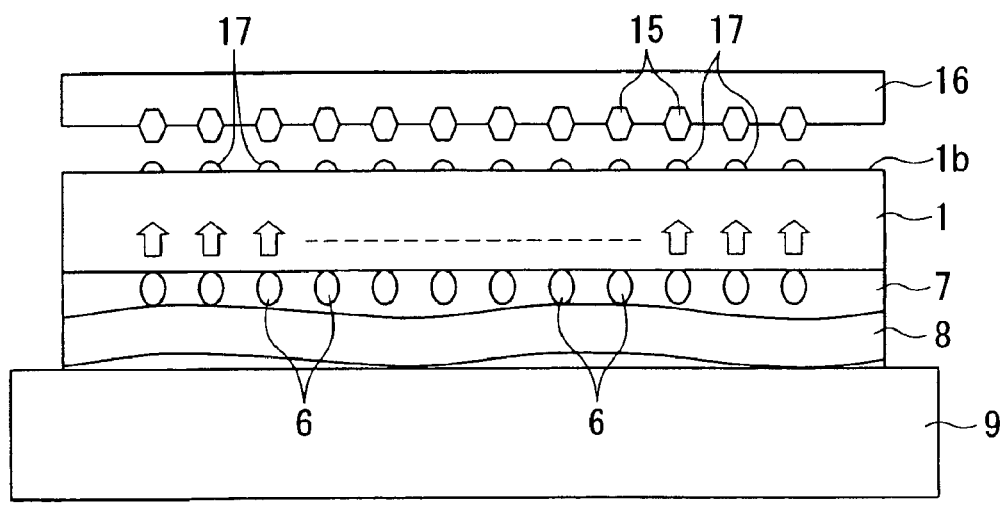
FIG. 7 shows a way in that a problem in a conventional thin silicon wafer occurs.
Figure 8:
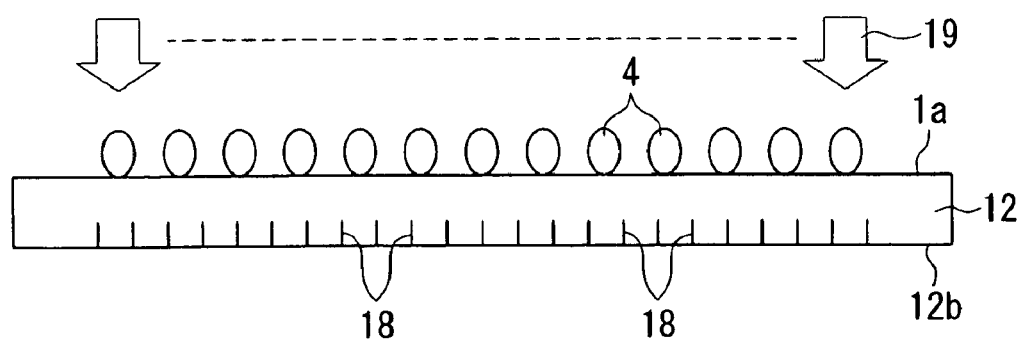
FIG. 8 shows other way in that a problem in a conventional thin silicon wafer occurs.
Figure 5A:
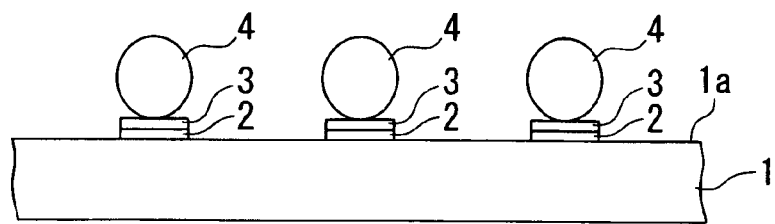
FIGS. 5A to 5E show an example for a conventional method for manufacturing a thin silicon wafer.
Figure 5B:
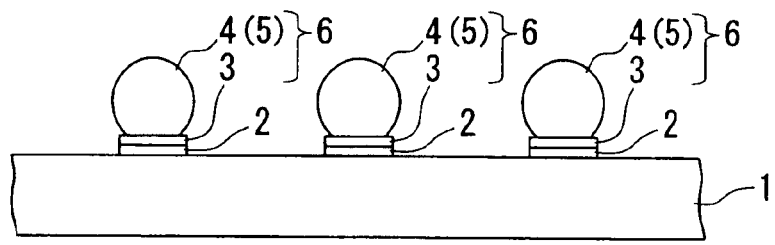
Figure 5C:
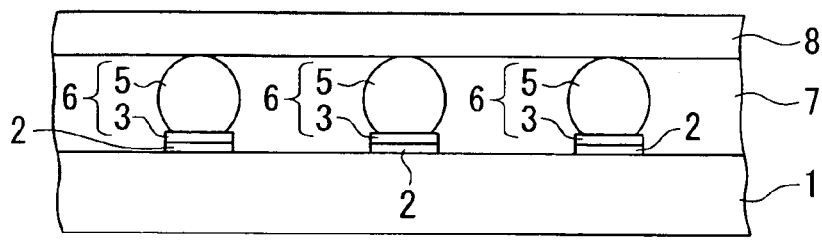
Figure 5D:
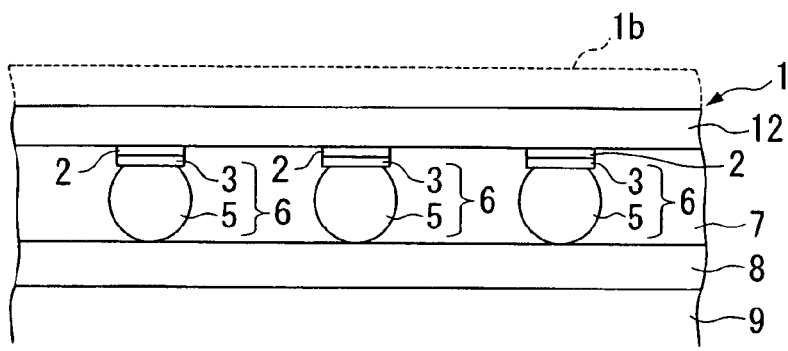
Figure 5E:
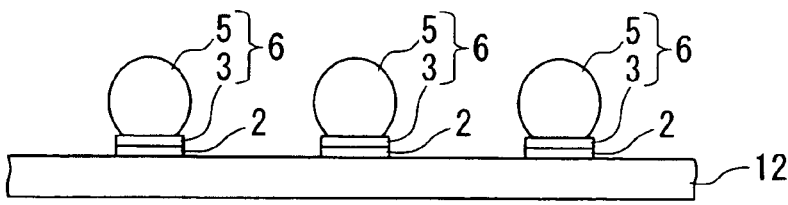
Figure 6A:
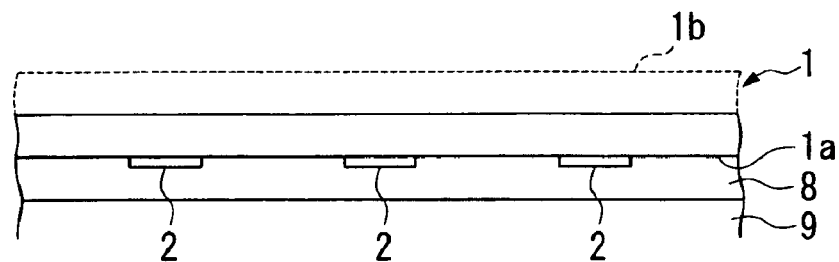
FIGS. 6A to 6D show other example for a conventional method for manufacturing a thin silicon wafer.
Figure 6B:
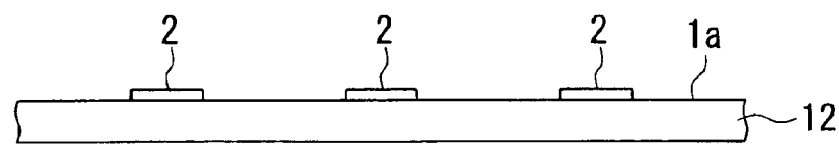
Figure 6C:
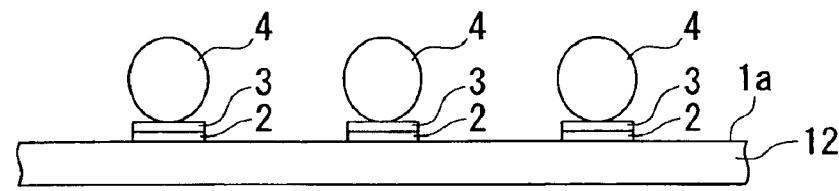
Figure 6D:
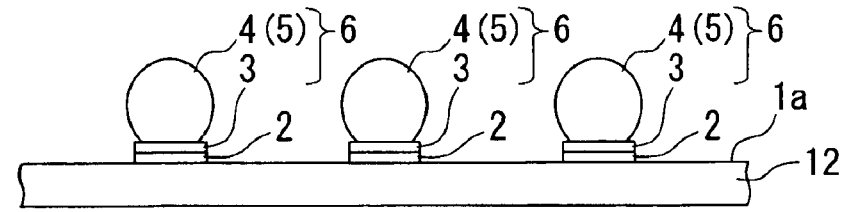

In such a case, a protecting tape 42 is applied on the back surface 41b on the silicon wafer 41 so as to protect the crystalline layer 32. Therefore, as shown in FIG. 4, there is not a concern that a crack and a split is formed on the silicon wafer 41 because the protecting tape 42 serves as a cushion member even if compression 19 is applied on the silicon wafer 41 when the solder balls 4 are compressed.

Figure 1E:
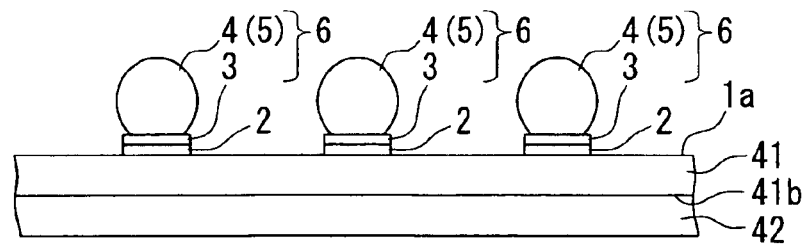

By doing this, as shown in FIG. 1E, the solder balls 4 melts so as to form the solder layers 5. Bumps 6 are formed on the pads 2 in a two-layer structure in which a metal plating layer 3 and the solder layer 5 are formed. Thus, semiconductor device according to the present embodiment can be produced.

Next, the silicon wafer 41 in which the bumps 6 are formed is tested so as to measure an electric characteristics therein. The semiconductor device according to the present embodiment can be produced by performing a necessary operation such the above wafer test and a dicing operation. Such a semiconductor device as a final product is shipped after the necessary packaging is conducted.

Here, it may be acceptable if the wafer test is performed after removing the protecting tape 8 from the surface 1a on the silicon wafer 41.

As explained above in detail, according to the semiconductor device in the present embodiment, the back surface 1b on the silicon wafer 1 is ground, the ground back surface 1b on the silicon wafer 1 is further mirror-finished, the breakable layer 31 which is formed in a grinding operation for the silicon wafer 1 is removed, and a crystalline layer 32 in which no micro-crack 18 can be observed is exposed. Therefore, there are effects in that a crack is not formed on the silicon wafer 41 because of a stress caused in a process for forming the bumps 6 with superior electric characteristics and reliability. Also, according to the present embodiment, finer semiconductor structure can be realized; therefore, it is possible to realize more integration in the semiconductor device by a lower production cost.

Also, it is possible to compress bump members directly on pads 2 made of aluminium members on the thin silicon wafer 41 when a gold (Au) ball or a gold (Au) wire is used for the bump member. By doing this, it is possible to omit a plating process in which a nickel member is used; therefore, it is possible to reduce the production cost greatly.

Also, according to a method for manufacturing a semiconductor device according to the present embodiment, the back surface 1b on the silicon wafer 1 is ground, the ground back surface 1b on the silicon wafer 1 is further mirror-finished, the breakable layer 31 which is formed in a grinding operation for the silicon wafer 1 is removed, and a crystalline layer 32 in which no micro-crack 18 can be observed is exposed. Therefore, there are effects in that a crack is not formed on the silicon wafer 41 because of a stress caused in a process for forming the bumps 6. As a result, it is possible to improve the production yield in a process for forming bumps. Also, it is possible to realize more integration in the semiconductor device by a lower production cost.

What is claimed is:

1. A semiconductor device wherein:

a principal surface of a semiconductor base board is ground mirror-finished such that a breakable layer on the principal surface is removed and a crystalline layer which is disposed innermore than the breakable layer is exposed; and bumps are formed on a predetermined position on another principal surface of the semiconductor base board.

* * * * *